US012740380B2

(12) United States Patent
Di

(10) Patent No.: US 12,740,380 B2
(45) Date of Patent: Sep. 15, 2026

(54) WAFER BONDING METHOD AND SYSTEM

(71) Applicant: YANGTZE MEMORY TECHNOLOGIES CO., LTD., Wuhan (CN)

(72) Inventor: Wenli Di, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 760 days.

(21) Appl. No.: 18/089,520

(22) Filed: Dec. 27, 2022

(65) Prior Publication Data

US 2023/0129273 A1 Apr. 27, 2023

Related U.S. Application Data

(63) Continuation of application No. PCT/CN2021/132523, filed on Nov. 23, 2021.

(30) Foreign Application Priority Data

Nov. 30, 2020 (CN) ........................ 202011375319.4

(51) Int. Cl.
*H01L 21/66* (2006.01)
*H01L 21/67* (2006.01)
(Continued)

(52) U.S. Cl.
CPC .......... *H10P 74/23* (2026.01); *H10P 72/0604* (2026.01)

(58) Field of Classification Search
CPC ............... H01L 22/20; H01L 21/67253; H01L 21/67092; H01L 24/75; H01L 24/80;
(Continued)

(56) References Cited

U.S. PATENT DOCUMENTS 7,371,663 B2 * 5/2008 Chen ..................... H01L 21/681 438/464
9,349,661 B2 5/2016 Ding et al.
(Continued)

FOREIGN PATENT DOCUMENTS

CN 107887306 A * 4/2018 ....... H01L 21/67294
CN 109451761 A 3/2019
(Continued)

OTHER PUBLICATIONS

International Search Report issued in corresponding International Application No. PCT/CN2021/132523, mailed on Feb. 17, 2022, 5 pages.

*Primary Examiner* — Jarrett J Stark
(74) *Attorney, Agent, or Firm* — BAYES PLLC

(57) ABSTRACT

Implementations of the present disclosure provides a wafer bonding method and system. The method comprises: providing a bonding relation which is used to indicate bonding between at least two wafer lots; acquiring basic information of wafer lots corresponding to the bonding relation according to the bonding relation; performing a first rule check on the basic information, and conveying the wafer lots to a bonding station after the check passes; updating the basic information of the wafer lots conveyed to the bonding station to obtain updated basic information; performing a second rule check on the updated basic information, and performing wafer bonding on the wafer lots conveyed to the bonding station according to the bonding relation after the check passes.

9 Claims, 3 Drawing Sheets

(51) Int. Cl.
*H10P 72/00* (2026.01)
*H10P 74/00* (2026.01)

(58) Field of Classification Search
CPC ..... H01L 25/0657; H01L 25/50; H01L 21/50; H01L 21/67121; H01L 21/67276; G05B 19/41865; G05B 2219/45031; Y02P 90/30; H10P 74/23; H10P 72/0604
See application file for complete search history.

(56) References Cited

U.S. PATENT DOCUMENTS

| | | | | |
|---|---|---|---|---|
| 2009/0130821 | A1* | 5/2009 | Cox | H01L 25/50 438/455 |
| 2020/0286853 | A1* | 9/2020 | Kawadahara | B81C 1/00357 |

FOREIGN PATENT DOCUMENTS

| | | | |
|---|---|---|---|
| CN | 110098140 | A | 8/2019 |
| CN | 110364442 | A | 10/2019 |
| CN | 111599742 | A | 8/2020 |
| CN | 112490136 | A | 3/2021 |
| KR | 20050118573 | A | 12/2005 |
| KR | 20170132441 | A | 12/2017 |
| TW | 201947674 | A | 12/2019 |

* cited by examiner

WAFER BONDING METHOD AND SYSTEM

CROSS-REFERENCE TO RELATED APPLICATION

This application is a continuation of International Application No. PCT/CN2021/132523, filed on Nov. 23, 2021 which claims the benefit of priority to China Patent Application No. 202011375319.4 filed on Nov. 30, 2020, both of which are incorporated herein by reference in their entireties.

TECHNICAL FIELD

Implementations of the present disclosure relate to the field of semiconductor manufacturing, in particular to a wafer bonding method and system.

BACKGROUND

Currently, a bonding procedure is generally manual controlled during existing wafer bonding process. The to be bonded wafers are generally selected according to the number of layers of the wafers in wafer cassettes. For example, a first wafer to be bonded is placed in a first wafer cassette, a second wafer to be bonded is placed in a second wafer cassette. The first wafer and the second wafer are taken out from a first layer of the first wafer cassette and a first layer of the second wafer cassette respectively for bonding. Such selection fails to consider various problems of the wafers placed in the wafer cassettes, such as wafer defects, etc. As such, a yield of bonded products can be low.

SUMMARY

Various implementations of the present disclosure provide a wafer bonding method and system to solve at least one problem described above.

In a first aspect, the present disclosure provides a wafer bonding method, comprising: providing a bonding relation which is used to indicate bonding between at least two wafer lots; acquiring basic information of wafer lots corresponding to the bonding relation according to the bonding relation; performing a first rule check on the basic information, and conveying the wafer lots to a bonding station after the check passes; updating the basic information of the wafer lots conveyed to the bonding station to obtain updated basic information; performing a second rule check on the updated basic information, and performing wafer bonding on the wafer lots conveyed to the bonding station according to the bonding relation after the check passes.

In one optional implementation, the basic information at least includes one of wafer lot process, wafer lot health, wafer grade, wafer abnormal status, wafer lot risk evaluation, wafer lot process different with standard process, and wafer lot defect.

In one optional implementation, before performing the first rule check on the basic information, the method further comprises: predicting a post-bonding yield of the wafer lots corresponding to the bonding relation according to the basic information to obtain predicted bonding result; and performing a first rule check if the predicted bonding result meets preset criteria.

In one optional implementation, before performing the first rule check on the basic information, the method further comprises: performing a third rule check on the basic information, and uploading the basic information to an information backup station after the check passes.

In one optional implementation, the third rule at least includes one of Product ID if match, wafer grade if match, wafer lot if arrange bonding, and wafer if bonding with multi wafer.

In one optional implementation, before performing the first rule check on the basic information, the method further comprises: checking if fabrication processes of the wafer lots are accomplished; transmitting wafer lot ID to a bonding station if the fabrication processes of the wafer lots are accomplished.

In one optional implementation, the first rule at least includes one of check wafer lot if accomplish process, Product ID if match, bond type and pairing group if match, wafer grade if match, wafer lot ID if cover every wafer, wafer lot if arrange bonding, and wafer if bonding with multi wafer.

In one optional implementation, the second rule at least includes one of check wafer lot if accomplish process, Product ID if match, bond type and pairing group if match, wafer grade if match, wafer lot ID if cover every wafer, wafer lot if arrange bonding, wafer if bonding with multi wafer, and wafer lot if qualified.

In one optional implementation, in the operation of the first rule check, the second rule check or the third rule check, a system error is reported, and a bonding relation is reacquired if the check fails.

In one optional implementation, before conveying the wafer lots to the bonding station, the method further comprises: acquiring fabrication processes of the wafer lots according to the basic information; and determining bond type according to the fabrication processes.

In one optional implementation, before performing the first rule check according to the basic information, the method further comprises: changing the bonding relation; determining if fabrication processes of the wafer lots corresponding to the bonding relation are accomplished; changing of the bonding relation succeeding if the fabrication processes of the wafer lot are not accomplished; changing of the bonding relation not succeeding if the fabrication processes of the wafer lot have been accomplished.

In one optional implementation, in the event that the changing of the bonding relation succeeds, the method further comprises: reacquiring basic information of changed wafer lots corresponding to changed bonding relation according to the changed bonding relation; performing the first rule check and the second rule check in sequence according to the basic information of the changed wafer lots, and performing wafer bonding according to the changed bonding relation after the checks pass.

In a second aspect, implementations of the present disclosure provides a wafer bonding system, comprising: a reception module for providing a bonding relation which is used to indicate bonding between at least two wafer lots; a processing module for acquiring basic information of wafer lots corresponding to the bonding relation according to the bonding relation; a transition module for performing a first rule check on the basic information, and conveying the wafer lots to a bonding station after the check passes; an updating module for updating the basic information of the wafer lots conveyed to the bonding station to obtain updated basic information; and a bonding module for performing a second rule check on the updated basic information, and performing wafer bonding on the wafer lots conveyed to the bonding station according to the bonding relation after the check passes.

In one optional implementation, the basic information at least includes one of wafer lot process, wafer lot health, wafer grade, wafer abnormal status, wafer lot risk evaluation, wafer lot process different with standard process, and wafer lot defect.

In one optional implementation, the wafer bonding system further comprises: a prediction module for predicting a post-bonding yield of the wafer lots corresponding to the bonding relation according to the basic information to obtain predicted bonding result; and performing a first rule check if the predicted bonding result meets preset criteria.

In one optional implementation, the wafer bonding system further comprises: a backup module for performing a third rule check on the basic information, and uploading the basic information to an information backup station after the check passes.

In one optional implementation, the third rule at least includes one of Product ID if match, wafer grade if match, wafer lot if arrange bonding, and wafer if bonding with multi wafer.

In one optional implementation, the wafer bonding system further comprises: a process control module for checking if fabrication processes of the wafer lots are accomplished; transmitting wafer lot ID to a bonding station if the fabrication processes of the wafer lots are accomplished.

In one optional implementation, the first rule at least includes one of check wafer lot if accomplish process, Product ID if match, bond type and pairing group if match, wafer grade if match, wafer lot ID if cover every wafer, wafer lot if arrange bonding, and wafer if bonding with multi wafer.

In one optional implementation, the second rule at least includes one of check wafer lot if accomplish process, Product ID if match, bond type and pairing group if match, wafer grade if match, wafer lot ID if cover every wafer, wafer lot if arrange bonding, wafer if bonding with multi wafer, and wafer lot if qualified.

In one optional implementation, in the operation that the transition module performs the first rule check, the bonding module performs the second rule check or the backup module performs the third rule check, a system error is reported and a bonding relation is reacquired by the reception module if the check fails.

In one optional implementation, the wafer bonding system further comprises: a determination module for acquiring fabrication processes of the wafer lots according to the basic information; determining bond type according to the fabrication processes.

In one optional implementation, the wafer bonding system further comprises: a changing module for changing the bonding relation; determining if the fabrication processes of the wafer lots corresponding to the bonding relation are accomplished; changing of the bonding relation succeeding if the fabrication processes of the wafer lots are not accomplished; changing of the bonding relation not succeeding if the fabrication processes of the wafer lots have been accomplished.

In one optional implementation, in the event that the changing of the bonding relation succeeds, the processing module is further used for reacquiring basic information of changed wafer lots corresponding to changed bonding relation according to the changed bonding relation;

The transition module is further used for performing a first rule check according to the basic information of the changed wafer lots, the bonding module is further used for performing a second rule check according to the basic information of the changed wafer lots, and performing wafer bonding according to the changed bonding relation after the check passes.

Implementations of the present disclosure provide a wafer bonding method and system. The method comprises: providing a bonding relation which is used to indicate bonding between at least two wafer lots; acquiring basic information of wafer lots corresponding to the bonding relation according to the bonding relation; performing a first rule check on the basic information, conveying the wafer lots to a bonding station after the check passes; updating the basic information of the wafer lots conveyed to the bonding station to obtain updated basic information; performing a second rule check on the updated basic information, and performing wafer bonding on the wafer lots conveyed to the bonding station according to the bonding relation after the check passes. Implementations of the present disclosure provides a wafer bonding method in which basic information of corresponding wafer lots is acquired through the bonding relation, a first rule check and a second rule check are performed based on the basic information of the wafer lots before bonding to ensure quality of the wafer lots during bonding, thus not only can a yield of wafer bonding be greatly increased, but also management and control for a bonding procedure can be strengthened.

DETAILED DESCRIPTION

Figure 1:
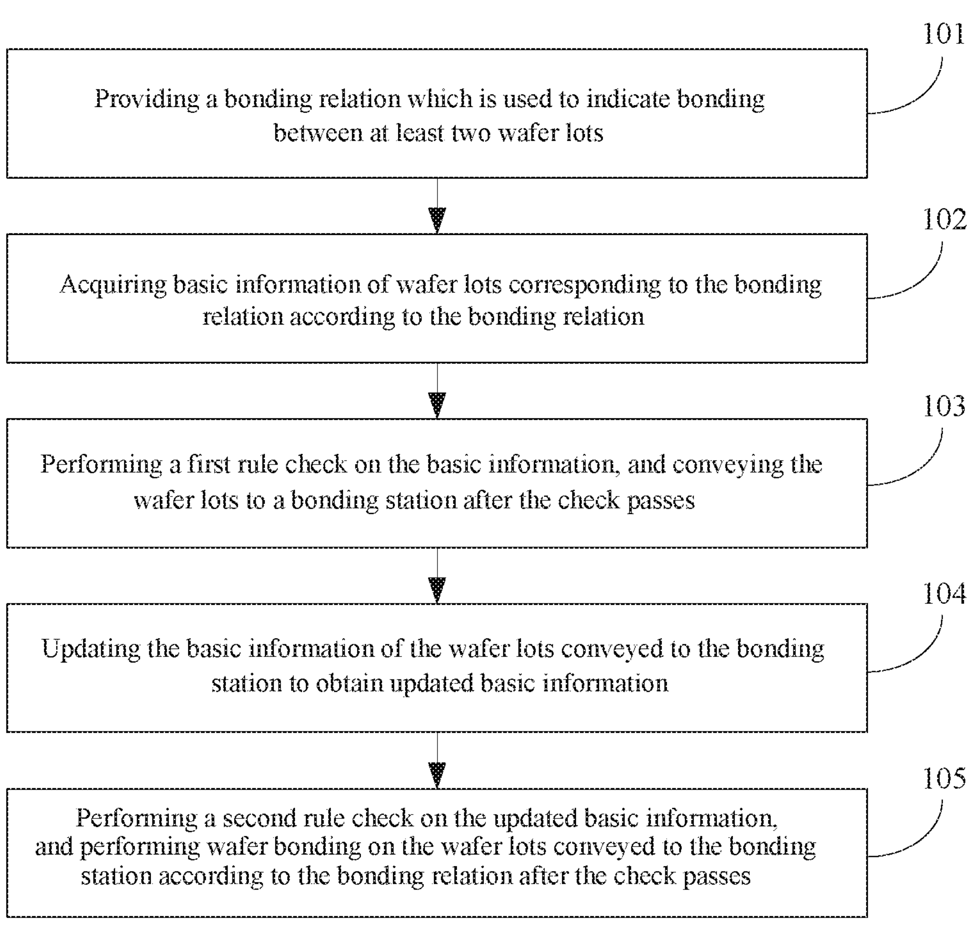
FIG. 1 is an implementation flow diagram of a wafer bonding method provided by implementations of the present disclosure.

Exemplary implementations disclosed by the present disclosure will be described below in more detail with reference to the figures. Although the exemplary implementations of the present disclosure are shown in the figures, it is to be understood that the present disclosure may be implemented by various forms without being limited by the specific implementations as set forth herein. Rather, these implementations are provided in order for understanding the present disclosure more thoroughly, and can fully convey the scope disclosed by the present disclosure to those skilled in the art.

In the description below, many specific details are presented to provide a more thorough understanding of the present disclosure. However, it is apparent to those skilled in the art that the present disclosure may be carried out without one or more of these details. In other examples, in order to avoid confusing with the present disclosure, some technical features well-known in the art are not described; that is, not all features of actual implementations are described herein, and well-known functions and structures are not described in detail.

In the figures, for clarity, dimensions and relative dimensions of layers, regions and elements may be exaggerated. Like reference numbers denote like elements throughout.

It should be understood that, spatially relative terms, such as “beneath”, “below”, “lower”, “under”, “above”, “upper”, and the like, may be used herein for ease of description to describe the relationship between one element or feature and other elements or features illustrated in the figures. It should be understood that the spatially relative terms are intended to further encompass different orientations of a device in use or operation in addition to the orientation depicted in the figures. For example, if a device in the figures is turned over, then an element or a feature described as “below other elements”, or “under them”, or “beneath them” will be orientated to “above” the other elements or features. Thus, the exemplary terms, “below” and “beneath”, may include both upper and lower orientations. The device may be orientated otherwise (rotated by 90 degrees or other orientations), and the spatially descriptive terms used herein are interpreted accordingly.

The terms used herein are only intended to describe the specific implementations, and are not used as limitations of the present disclosure. As used herein, “a”, “an” and “the” in a singular form are also intended to include a plural form unless otherwise indicated expressly in the context. It should also be understood that the terms “consist of” and/or “comprise”, when used in this specification, determine the presence of the feature, integer, operation, operation, element and/or component, but do not preclude the presence or addition of one or more other features, integers, operations, operations, elements, components, and/or lots. As used herein, the term “and/or” includes any and all combinations of the listed relevant items.

Implementations of the present disclosure provide a wafer bonding method. FIG. 1 is an exemplary flow diagram of a wafer bonding method provided by implementations of the present disclosure. As shown in FIG. 1, the method can comprise the following operations.

Operation 101: a bonding relation between at least two wafer lots is provided.

In the implementations of the present disclosure, the bonding relation is provided, which is used to indicate the bonding between at least two wafer lots. For example, the bonding relation can indicate bonding between a first wafer lot and a second wafer lot. It should be noted that, various implementations of the present disclosure are not limited. A bonding relation among more than two wafer lots may also be used in the wafer bonding method provided by the implementations of the present disclosure. In a practical application, the bonding relation of two or more wafer lots required to be bonded may be set according to actual bonding demands. It should be noted that the implementations of the present disclosure are described by taking the bonding relation for indicating the bonding between two wafer lots as an example. However, during performance of the wafer bonding method, multiple sets of the above bonding relations may be included. In other words, in a practical application, the wafer bonding method provided by the implementations of the present disclosure may be performed according to multiple sets of bonding relations. Herein, wafers in the wafer lots corresponding to the bonding relation may comprise silicon, germanium, silicon carbide, silicon on insulating substrate, or a combination thereof. In some implementations, the wafers in the wafer lots corresponding to the bonding relation may comprise silicon (e.g., monocrystalline silicon, polycrystalline silicon), silicon germanium, gallium arsenide, germanium, a silicon-coated insulator, a germanium-coated insulator, or any suitable combination thereof. In a practical application, the first wafer lot may be a memory array wafer lot, the second wafer lot may be a peripheral circuit wafer lot.

In the implementations of the present disclosure, 25 wafers may be defined as a wafer lot. Fabrication processes of the wafer lot are all performed in a form of wafer lot. It should be noted that the number of wafers in the first wafer lot and the number of wafers in the second wafer lot are the same, so that the wafers in the first wafer lot and the wafers in the second wafer lot can be bonded in a one-to-one correspondence manner. In a practical application, the bonding between the first wafer lot and the second wafer lot is specifically bonding between one of the wafers in the first wafer lot and one of the wafers in the second wafer lot.

It should be noted that, when the bonding relation is provided, the wafer lots corresponding to the bonding relation may have not accomplished their fabrication processes. Since there are many early check procedures in the bonding method provided by the implementations of the present disclosure, early checks of the bonding process may be performed when the wafer lots do not accomplish their fabrication processes in order to save bonding time.

Operation 102: basic information of the wafer lots corresponding to the bonding relation is acquired according to the bonding relation.

In the implementations of the present disclosure, the basic information of the wafer lots corresponding to the bonding relation is acquired from a wafer fabrication process control system according to the bonding relation. The basic information at least includes one of wafer lot process, wafer lot health, wafer grade, wafer abnormal status, wafer lot risk evaluation, wafer lot process different with standard process, and wafer lot defect.

Figure 2:
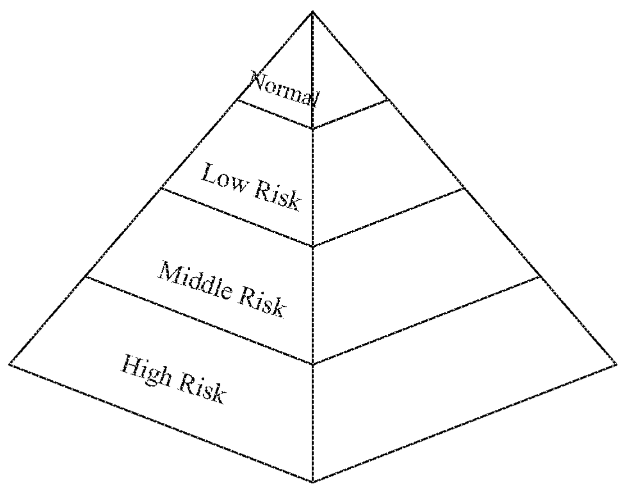
FIG. 2 is a schematic diagram of a wafer grade provided by implementations of the present disclosure.

FIG. 2 is a schematic diagram of a wafer grade provided by implementations of the present disclosure. As shown in FIG. 2, the wafers in the wafer lots may be classified into four grades, i.e., normal, low risk, middle risk and high risk.

In the implementations of the present disclosure, the wafer fabrication process control system is a system controlling all fabrication processes of the wafer lots. There is every process flow that the wafers need to undergo in the wafer fabrication process control system. That is, the wafer fabrication process control system will arrange processes that the memory array wafer lot and the peripheral circuit wafer lot need to undergo.

In the implementations of the present disclosure, a post-bonding yield of the wafer lots corresponding to the bonding relation may also be predicted according to the basic information to obtain predicted bonding result; and a first rule check is performed if the predicted bonding result meets preset criteria. In a practical application, a process nature and yield of the wafer lots corresponding to the bonding relation may also be predicted according to the basic information first, and then the post-bonding yield of the wafer lots are predicted based on the process nature and the yield of the wafer lots to obtain the predicted bonding result. The first rule check is performed in the event that the predicted bonding result meets the preset criteria.

In the implementations of the present disclosure, before performing the first rule check, a third rule check may also be performed on the basic information, the basic information is uploaded to an information backup station after the check passes. The third rule at least includes one of Product ID if match, wafer grade if match, wafer lot if arrange bonding, and wafer if bonding with multi wafer. Herein, the third rule is a bonding rule. The performing the third rule check on the basic information is to perform a bonding rule check on the basic information. Herein, the Product ID if match is taken as an example for description, the number of layers of a product and a fabrication process of the product may be obtained by a product ID, for example, a 64-layer product, a 64-layer memory array process, and a 64-layer peripheral circuit process. It is judged if the number of layers and a fabrication process of the wafers in the wafer lots match with the number of layers of the product and the fabrication process of the product obtainable by the product ID based on the basic information of the wafer lots, and the first rule check passes if so.

In the implementations of the present disclosure, in the operation of the third rule check, if the check fails, a system error is reported and a bonding relation is reacquired. In a practical application, if the third rule check fails, a system error is reported and an engineer will update the bonding relation after receiving a system error instruction, so that an updated bonding relation may be reacquired after system refreshing.

In the implementations of the present disclosure, the information backup station may be an information transmission station between the wafer fabrication process control system and a bonding management system. The basic information is uploaded to the information backup station, so that the bonding management system can acquire the basic information from the information backup station.

In the implementations of the present disclosure, after performing the third rule check, it may be checked if the fabrication processes of the wafer lots are accomplished; wafer lot ID is transmitted to a bonding station if the fabrication processes of the wafer lots are accomplished. In a practical application, it may be checked if the fabrication processes of the memory array wafer lot and the peripheral circuit wafer lot are accomplished respectively; a memory array wafer lot ID is transmitted to the bonding station first if the fabrication process of the memory array wafer lot is accomplished first; a peripheral circuit wafer lot ID may be transmitted to the bonding station first if the fabrication process of the peripheral circuit wafer lot is accomplished first. Herein, the bonding station is a station performing the bonding process, and the bonding process of the bonding station is controlled by the bonding management system.

Operation 103: the first rule check is performed on the basic information, the wafer lots are conveyed to the bonding station after the check passes.

In the implementations of the present disclosure, the first rule check is performed on the basic information, the wafer lots are conveyed to the bonding station after the check passes. The first rule at least includes one of the following: determining whether a fabricating process of one wafer lot is accomplished; determining whether a mapping of a product identification of the one wafer lot is correct; determining whether a bond type mapping and a wafer paring mapping of the one wafer lot are correct; determining whether a wafer grade mapping of the one wafer lot is correct; determining whether a wafer lot identification of the one wafer lot covers every wafers in the one wafer lot; determining whether a bonding arrangement of the one wafer lot is setup; and determining whether the one wafer lot is to be bonded with multiple wafers. Herein, after the first rule check passes, the wafer lots are conveyed from the wafer fabrication process control system to the bonding station of the bonding management system.

In the implementations of the present disclosure, in the operation of the first rule check, if the check fails, a system error is reported and a bonding relation is reacquired. In a practical application, if the first rule check fails, a system error is reported an engineer will update the bonding relation after receiving a system error instruction, so that an updated bonding relation may be reacquired after system refreshing.

In the implementations of the present disclosure, before conveying the wafer lots to the bonding station, the method may further comprise: acquiring fabrication processes of the wafer lots according to the basic information; determining bond type according to the fabrication processes. Herein, acquiring the fabrication processes of the wafer lots according to the basic information may specifically comprise: acquiring the fabrication process of the memory array wafer lot and the fabrication process of the peripheral circuit wafer lot according to the basic information, and classifying bonding of the memory array wafer lot and the peripheral circuit wafer lot according to the fabrication process of the memory array wafer lot and the fabrication process of the peripheral circuit wafer lot. In a practical application, bonding classification may be performed on the wafer lots according to risk levels brought by the fabrication processes of the wafer lots. Based on the bond types obtained by the bonding classification, the different bond types correspond to different bonding yields, so that the bonding yields may be obtained based on the bond types. It should be noted that the bonding yield here is only a predicted yield.

Operation 104: the basic information of the wafer lots conveyed to the bonding station is updated to obtain the updated basic information.

In the implementations of the present disclosure, after the wafer lots arrive at the bonding station, the basic information of the wafer lots is updated to obtain the updated basic information. Herein, the updated basic information may be acquired from the wafer fabrication process control system.

Operation 105: a second rule check is performed on the updated basic information, and performing wafer bonding on the wafer lots conveyed to the bonding station according to the bonding relation after the check passes.

In the implementations of the present disclosure, the second rule check is performed on the updated basic information, the bonding management system controls to perform the wafer bonding on the wafer lots conveyed to the bonding station according to the bonding relation after the check passes. The second rule at least includes one of the following: determining whether a fabricating process of the one wafer lot is accomplished; determining whether a mapping of a product identification of the one wafer lot is correct; determining whether a bond type mapping and a wafer paring mapping of the one wafer lot are correct; determining whether a wafer grade mapping of the one wafer lot is correct; determining whether a wafer lot identification of the one wafer lot covers every wafers in the one wafer lot; determining whether a bonding arrangement of the one wafer lot is setup; determining whether the one wafer lot is to be bonded with multiple wafers; and determining whether the one wafer lot is qualified. Herein, wafer lot if qualified is used for determining if an accident (for example, being contaminated, etc.) happens when the wafer lots are conveyed to the bonding station.

In the implementations of the present disclosure, in the operation of the second rule check, if the check fails, a system error is reported, and a bonding relation is reacquired. In a practical application, if the second rule check fails, a system error is reported and an engineer will update the bonding relation after receiving a system error instruction, so that an updated bonding relation may be reacquired after system refreshing.

In the implementations of the present disclosure, a bonding information system is further disposed in the implementations of the present disclosure, which tracks process progresses of the wafer lots at any time, every process undergone by the wafer lots will be recorded by the bonding information system; besides, the wafer lot health, the wafer grade, the wafer abnormal status, the wafer lot risk evaluation, the wafer lot process different with standard process, and the wafer lot defect will be also recorded by the bonding information system. Therefore, during the check of the wafer lots in the bonding process, the bonding check can be performed through the basic information of the wafer lots themselves, and the bonding is performed based on the basic information.

In the implementations of the present disclosure, the bonding relation may also be changed, which is specifically in process: changing the bonding relation; determining if the fabrication processes of the wafer lots corresponding to the bonding relation are accomplished; changing of the bonding relation succeeding if the fabrication processes of the wafer lots are not accomplished; changing of the bonding relation not succeeding if the fabrication processes of the wafer lots have been accomplished. In some implementations, it may be first determined if the fabrication processes of the wafer lots corresponding to the bonding relation are accomplished; the bonding relation is changed if the fabrication processes of the wafer lots are not accomplished; and the bonding relation cannot be changed if the fabrication processes of the wafer lots have been accomplished.

In the implementations of the present disclosure, in the event that the changing of the bonding relation succeeds, basic information of changed wafer lots corresponding to changed bonding relation is reacquired according to the changed bonding relation; the third rule check, the first rule check and the second rule check are performed in sequence according to the basic information of the changed wafer lots, the wafer bonding is performed according to the changed bonding relation after the checks pass.

The wafer bonding method provided by the implementations of the present disclosure is also applicable to the case that the bonding relation is not provided, the wafers to be bonded may be provided directly, a series of pre-bonding checks are performed on the wafers to be bonded by the above wafer bonding method, and the wafer bonding is performed after the checks pass.

Implementations of the present disclosure provides a wafer bonding method, which comprises: providing a bonding relation which is used to indicate bonding between at least two wafer lots; acquiring basic information of wafer lots corresponding to the bonding relation according to the bonding relation; performing a first rule check on the basic information, conveying the wafer lots to a bonding station after the check passes; updating the basic information of the wafer lots conveyed to the bonding station to obtain updated basic information; performing a second rule check on the updated basic information, and performing wafer bonding on the wafer lots conveyed to the bonding station according to the bonding relation after the check passes. Implementations of the present disclosure provides a wafer bonding method in which basic information of corresponding wafer lots is acquired through provided bonding relation, a first rule check and a second rule check are performed based on the basic information of the wafer lots before bonding to ensure quality of the wafer lots during bonding, thus not only can a yield of wafer bonding be greatly increased, but also management and control for a bonding procedure can be strengthened.

Figure 3:
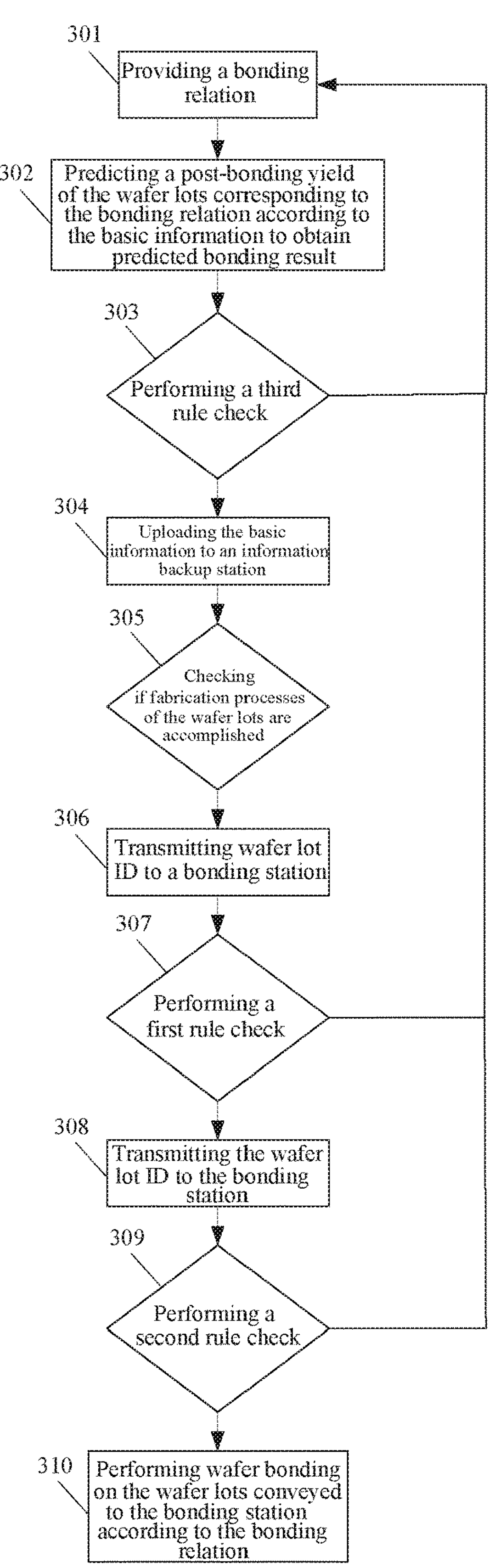
FIG. 3 is an implementation flow diagram of a wafer bonding method provided by implementations of the present disclosure.

Implementations of the present disclosure provides a wafer bonding method. FIG. 3 is an implementation flow diagram of a wafer bonding method provided by implementations of the present disclosure. The method mainly comprises the following operations:

Operation 301: a bonding relation is provided.

In the implementations of the present disclosure, the bonding relation is used to indicate bonding between at least two wafer lots; basic information of wafer lots corresponding to the bonding relation is acquired according to the bonding relation.

Operation 302: a post-bonding yield of the wafer lots corresponding to the bonding relation is predicted according to the basic information to obtain predicted bonding result.

In the implementations of the present disclosure, if the predicted bonding result meets preset criteria, operation 303 is performed; if the predicted bonding result fails to meet the preset criteria, a system refuses bonding, and it returns to operation 301.

Operation 303: a third rule check is performed.

In the implementations of the present disclosure, if the third rule check passes, operation 304 is performed; if the third rule check fails, a system error is reported and the system is refreshed, and after the system error is handled by system refreshing, it returns to operation 301 to reacquire a bonding relation.

Operation 304: the basic information is uploaded to an information backup station.

Operation 305: it is checked if fabrication processes of the wafer lots are accomplished.

In the implementations of the present disclosure, if the fabrication processes of the wafer lots are accomplished, operation 306 is performed; if the fabrication processes of the wafer lots are not accomplished, operation 306 is performed after the fabrication processes of the wafer lots are accomplished.

Operation 306: wafer lot ID is transmitted to a bonding station.

Operation 307: a first rule check is performed.

In the implementations of the present disclosure, if the first rule check passes, operation 308 is performed; if the first rule check fails, a system error is reported and the system is refreshed, and after the system error is handled by system refreshing, it returns to operation 301 to reacquire a bonding relation.

Operation 308: the wafer lots are conveyed to a bonding station.

Operation 309: a second rule check is performed.

In the implementations of the present disclosure, if the second rule check passes, operation 310 is performed; if the second rule check fails, a system error is reported and the system is refreshed, and after the system error is handled by system refreshing, it returns to operation 301 to reacquire a bonding relation.

Operation 310: wafer bonding is performed on the wafer lots conveyed to the bonding station according to the bonding relation.

Implementations of the present disclosure provides a wafer bonding method which first predicts bonding result through basic information of wafer lots, performs a third rule check, a first rule check and a second rule check in sequence in the event that the bonding result meets preset criteria, and performs wafer bonding on the wafer lots conveyed to a bonding station according to the bonding relation after the checks all pass. As such, multiple checks are arranged to guarantee a yield of wafers during bonding and a post-bonding yield in the method. Further, during every check, a system error will be reported to facilitate troubleshooting and solution by an engineer if the check fails, thereby contributing to management and control and optimization for a bonding procedure.

Figure 4:
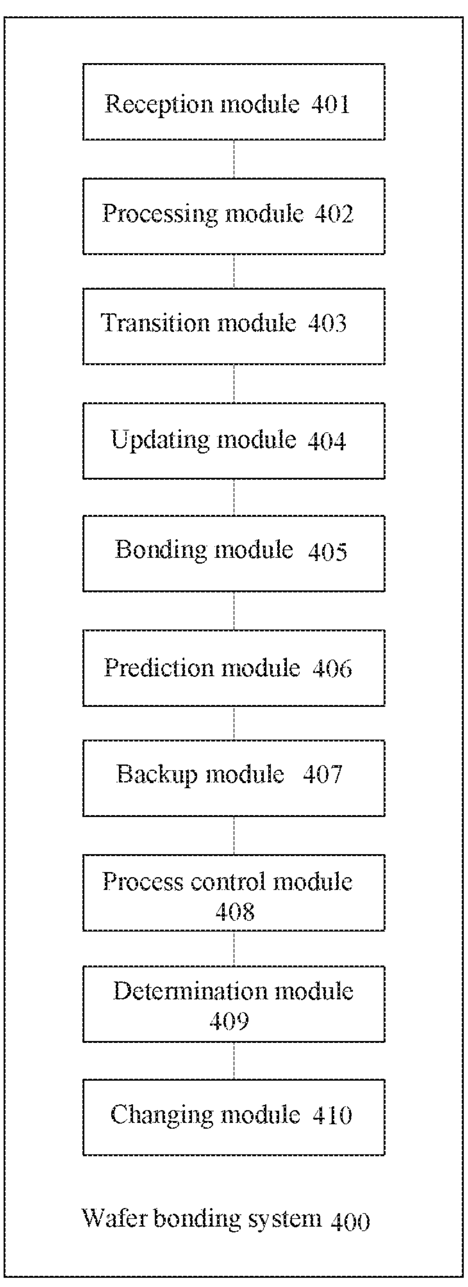
FIG. 4 is a composition structure diagram of a wafer bonding system provided by implementations of the present disclosure.

Based on the same technical conception as the foregoing wafer bonding method, implementations of the present disclosure provides a wafer bonding system. In some implementations, the wafer bonding system may be implemented by way of software modules. FIG. 4 is a composition structure diagram of a wafer bonding system provided by implementations of the present disclosure. With reference to FIG. 4, the wafer bonding system 400 provided by the implementations of the present disclosure comprises:

a reception module 401 for providing a bonding relation which is used to indicate bonding between at least two wafer lots;

a processing module 402 for acquiring basic information of wafer lots corresponding to the bonding relation according to the bonding relation;

a transition module 403 for performing a first rule check on the basic information, and conveying the wafer lots to a bonding station after the check passes;

an updating module 404 for updating the basic information of the wafer lots conveyed to the bonding station to obtain updated basic information;

a bonding module 405 for performing a second rule check on the updated basic information, and performing wafer bonding on the wafer lots conveyed to the bonding station according to the bonding relation after the check passes.

In other implementations, the basic information at least includes one of wafer lot process, wafer lot health, wafer grade, wafer abnormal status, wafer lot risk evaluation, wafer lot process different with standard process, and wafer lot defect.

In other implementations, the wafer bonding system further comprises: a prediction module 406 for predicting a post-bonding yield of the wafer lots corresponding to the bonding relation according to the basic information to obtain predicted bonding result; and performing a first rule check if the predicted bonding result meets preset criteria.

In other implementations, the wafer bonding system further comprises: a backup module 407 for performing a third rule check on the basic information, and uploading the basic information to an information backup station after the check passes.

In other implementations, the third rule at least includes one of Product ID if match, wafer grade if match, wafer lot if arrange bonding, and wafer if bonding with multi wafer.

In other implementations, the wafer bonding system further comprises:

a process control module 408 for checking if fabrication processes of the wafer lots are accomplished;

transmitting wafer lot ID to the bonding station if the fabrication processes of the wafer lots are accomplished.

In other implementations, the first rule at least includes one of check wafer lot if accomplish process, Product ID if match, bond type and pairing group if match, wafer grade if match, wafer lot ID if cover every wafer, wafer lot if arrange bonding, wafer if bonding with multi wafer.

In other implementations, the second rule at least includes one of check wafer lot if accomplish process, Product ID if match, bond type and pairing group if match, wafer grade if match, wafer lot ID if cover every wafer, wafer lot if arrange bonding, wafer if bonding with multi wafer, and wafer lot if qualified.

In other implementations, in the operation that the transition module 403 performs the first rule check, the bonding module 405 performs the second rule check or the backup module 407 performs the third rule check, if the check fails, a system error is reported and a bonding relation is reacquired by the reception module 401.

In one particular implementation, information interaction among the modules of the wafer bonding system provided by the implementations of the present disclosure is as follows:

The reception module is used for providing a bonding relation which is used to indicate bonding between at least two wafer lots, and the reception module provides the bonding relation to the processing module.

The processing module is used for acquiring basic information of wafer lots corresponding to the bonding relation according to the bonding relation, and providing the basic information to the predication module.

The prediction module is used for predicting a post-bonding yield of the wafer lots corresponding to the bonding relation according to the basic information to obtain predicted bonding result. If the predicted bonding result meets preset criteria, the basic information is provided to the backup module.

The backup module is used for performing a third rule check on the basic information. If the third rule check passes, the basic information is uploaded to an information backup station; if the third rule check fails, a system error is reported and the system is refreshed, and after the system error is handled by system refreshing, it returns to the reception module to reacquire a bonding relation.

The process control module is used for checking if fabrication processes of the wafer lots are accomplished. If the fabrication processes of the wafer lots are accomplished, wafer lot ID is transmitted to a bonding station; if the fabrication processes of the wafer lots are not accomplished, the wafer lot ID is transmitted to the bonding station after the fabrication processes of the wafer lots are accomplished.

The transition module is used for performing a first rule check on the basic information. If the first rule check passes, the wafer lots are conveyed to the bonding station; if the first rule check fails, a system error is reported and the system is refreshed, and after the system error is handled by system refreshing, it returns to the reception module to reacquire a bonding relation.

The updating module is used for updating the basic information of the wafer lots conveyed to the bonding station to obtain updated basic information, and providing the updated bonding station to the bonding module.

The bonding module is used for performing a second rule check on the updated basic information. If the second rule check passes, wafer bonding is performed on the wafer lots conveyed to the bonding station according to the bonding relation; if the second rule check fails, a system error is reported and the system is refreshed, and after the system error is handled by system refreshing, it returns to the reception module to reacquire a bonding relation.

In other implementations, the wafer bonding system further comprises:

a determination module 409 for acquiring fabrication processes of the wafer lots according to the basic information; determining bond type according to the fabrication processes.

In other implementations, the wafer bonding system further comprises:

a changing module 410 for changing the bonding relation; determining if the fabrication processes of the wafer lots corresponding to the bonding relation are accomplished; changing of the bonding relation succeeding if the fabrication processes of the wafer lots are not accomplished; changing of the bonding relation not succeeding if the fabrication processes of the wafer lots have been accomplished.

In other implementations, in the event that the changing of the bonding relation succeeds, the processing module 402 is further used for reacquiring basic information of changed wafer lots corresponding to changed bonding relation according to the changed bonding relation;

The transition module 403 is further used for performing a first rule check according to the basic information of the changed wafer lots, the bonding module 405 is further used for performing a second rule check according to the basic information of the changed wafer lots, and performing wafer bonding according to the changed bonding relation after the checks pass.

Various constituent parts in the implementations of the present disclosure may be integrated into one processing unit, or each unit may be physically present individually, or two or more units may be integrated into one unit. The above integrated unit may be implemented in a hardware form and may also be implemented in a form of software function modules.

It may be understood that these implementations described herein may be implemented using hardware, software, firmware, middleware, microcodes, or a combination thereof. For hardware implementation, the processing unit may be implemented in one or more application specific integrated circuits (ASIC), digital signal processing (DSP), a DSP device (DSPD), a programmable logic device (PLD), a field-programmable gate array (FPGA), a general-purpose processor, a controller, a microcontroller, a microprocessor, other electronic units for performing the functionalities of the present disclosure, or a combination thereof.

For software implementation, the technology described herein may be implemented by modules (e.g., processes, functions, etc.) performing the functionalities described herein. Software codes may be stored in a memory, and executed by a processor. The memory may be implemented in or external to the processor.

Implementations of the present disclosure further provide a wafer bonding system which comprises a network interface for implementing connection communication between the components; a memory for storing executable instructions; a processor for implementing the wafer bonding method as described in the above technical solution when executing the executable instructions stored in the memory.

Implementations of the present disclosure further provide a storage medium storing a computer program which, when executed by at least one processor, implements the wafer bonding method as described in the above technical solution.

It is to be understood that, references to “one implementation” or “an implementation” throughout this specification mean that particular features, structures, or characteristics related to the implementation are included in at least one implementation of the present disclosure. Therefore, “in one implementation” or “in an implementation” present everywhere throughout this specification does not necessarily refer to the same implementation. Furthermore, these particular features, structures, or characteristics may be incorporated in one or more implementations in any suitable manner. It is to be understood that, in various implementations of the present disclosure, sequence numbers of the above processes do not indicate an execution sequence, an execution sequence of various processes shall be determined by functionalities and intrinsic logics thereof, and shall constitute no limitation on an implementation process of the implementations of the present disclosure. The above sequence numbers of the implementations of the present disclosure are only for description, and do not represent goodness and badness of the implementations.

In several implementations provided by the present disclosure, it should be understood that the disclosed method and apparatus may be implemented by other manners. The apparatus implementations as described above are only illustrative, for example, the division of the units is only a logical functional division. In a real implementation, there may be other manners for division. For instance, a plurality of units or components may be combined, or may be integrated in another system, or some features can be ignored or not performed. In addition, the coupling or direct coupling or communication connection between various constituent parts as shown or as discussed may be implemented through indirect coupling or communication connection of some interfaces, devices or units, and may be electrical, mechanical or other forms.

The above units described as discrete components may or may not be physically separated. The components shown as units may or may not be physical units, that is, they may be located in one place, or may be distributed onto a plurality of network units; part or all of the units may be selected for realizing the purposes of the solution of the implementation according to actual needs.

In addition, various functional units in various implementations of the present disclosure may be all integrated into one processing unit, or each unit may serve as one unit individually, or two or more units may be integrated into one unit; the above integrated unit may be implemented in a hardware form or in a form of hardware and software functional units. A person of ordinary skill in the art may understand that all or part of the operations of the above method implementations may be completed by a hardware related to program instruction. The foregoing program may be stored in a computer-readable storage medium, the operations including the above method implementations are performed when the program is executed; and the foregoing storage medium includes various media that can store program codes, such as a mobile storage device, a read-only memory (ROM), a random access memory (RAM), a magnetic disk, or an optical disk, or the like.

The methods disclosed in several method implementations provided by the present disclosure may be combined arbitrarily to obtain new method implementations in case of no conflicts.

The features disclosed in several product implementations provided by the present disclosure may be combined arbitrarily to obtain new product implementations in case of no conflicts.

The features disclosed in several method or device implementations provided by the present disclosure may be combined arbitrarily to obtain new method or device implementations in case of no conflicts.

The above descriptions are merely specific implementations of the present disclosure, but the protection scope of the present disclosure is not limited to these. Any variation or replacement readily figured out by those skilled in the art within the technical scope disclosed by the present disclosure shall fall within the protection scope of the present disclosure. Therefore, the protection scope of the present disclosure shall be subject to the protection scope of the claims.

What is claimed is:

1. A system for wafer bonding, comprising:

a memory for storing executable instructions; and a processor configured to, when executing the executable instructions stored in the memory:

receive a bonding relation of at least two wafer lots, obtain basic information of the at least two wafer lots based on the bonding relation, determine whether a first rule check is passed based on the basic information, in response to determining that the first rule check is passed, instruct a transition module to deliver the at least two wafer lots to a bonding station, update the basic information of the at least two wafer lots after the at least two wafer lots arrive at the bonding station, determine whether a second rule check is passed based on the updated basic information, and in response to determining that the second rule check is passed, instruct a bonding module to perform wafer bonding operations to the at least two wafer lots at the bonding station.

2. The system of claim 1, wherein the processor is further configured to predict a bonding yield of the at least two wafer lots based on the bonding relation; and in responding to determining that the predicted bonding yield reaches a preset threshold, apply the first rule check based on the basic information.

3. The system of claim 2, wherein the processor is further configured to:

in response to determining that a third rule check based on the basic information is passed, upload the basic information to an information backup station.

4. The system of claim 2, wherein the processor is further configured to:

in response to determining that a fabricating process of one wafer lot is accomplished, transmit a wafer lot identification of the one wafer lot to the bonding station.

5. The system of claim 3, wherein the processor is further configured to:

in response to determining that one of the first rule check, the second rule check, and the third rule check is failed, report a system error and requesting a new bonding relation.

6. The system of claim 2, wherein the processor is further configured to:

before delivering the at least two wafer lots to the bonding station, obtain fabrication process information of the at least two wafer lots based on the basic information, and determine a bond type of the at least two wafer lots based on the fabrication process information.

7. The system of claim 6, wherein the processor is further configured to:

receive an adjusted bonding relation; and determine whether a fabrication process of a new wafer lot corresponding to the adjusted bonding relation is accomplished.

8. The system of claim 7, wherein the processor is further configured to:

replace the bonding relation with the adjusted bonding relation in response to determining that the fabrication process of the new wafer lot is accomplished, and maintain the bonding relation in response to determining that the fabrication process of the new wafer lot is not accomplished.

9. The system of claim 7, wherein the processor is further configured to obtain basic information of the new wafer lot based on the adjusted bonding relation; and in response to determining that the first rule check is passed based on the basic information of the new wafer lot, instruct the transition module to deliver the new wafer lot to the bonding station.

* * * * *